United States Patent [19]
Hirokane et al.

[11] Patent Number: 5,286,583
[45] Date of Patent: Feb. 15, 1994

[54] METHOD OF MANUFACTURING A PHOTOMASK FOR AN OPTICAL MEMORY

[75] Inventors: Junji Hirokane; Tetsuya Inui, both of Nara; Michinobu Mieda, Shiki; Kenji Ohta, Kitakatsuragi, all of Japan

[73] Assignee: Sharp Kabushiki Kaisha, Osaka, Japan

[21] Appl. No.: 798,616

[22] Filed: Nov. 26, 1991

[30] Foreign Application Priority Data

Nov. 30, 1990 [JP] Japan ................. 2-339758

[51] Int. Cl.⁵ .................................. G03F 9/00
[52] U.S. Cl. ............................ 430/5; 430/321; 430/323; 430/324
[58] Field of Search ............. 430/5, 321–323, 430/324, 945; 369/277, 284, 285

[56] References Cited

U.S. PATENT DOCUMENTS

| | | | |
|---|---|---|---|
| 4,839,251 | 6/1989 | Ohta et al. | 430/321 |
| 5,087,535 | 2/1992 | Hirokane et al. | 430/5 |

FOREIGN PATENT DOCUMENTS

| | | |
|---|---|---|
| 0241028 | 10/1987 | European Pat. Off. |
| 2-029955 | 1/1990 | Japan . |
| 2-073545 | 3/1990 | Japan . |

*Primary Examiner*—Marion E. McCamish
*Assistant Examiner*—S. Rosasco
*Attorney, Agent, or Firm*—David G. Conlin; George W. Neuner

[57] ABSTRACT

A method of manufacturing a photomask for an optical memory, the photomask having two types of pattern where guide tracks and formatting pits are different in amount of optical transmissions, including the steps of (a) forming on a transparent substrate a thin film of which light transmission amount depends upon its thickness; (b) forming a photoresist film on the thin film; (c) exposing the photoresist film to light with different light intensities depending selectively on the guide tracks or formatting pits; (d) eliminating the photoresist film exposed to the more intense light by the development till the thin film becomes surface; (e) etching the thin film exposed to the more intense light and surfaced; (f) eliminating the photoresist film till the thin film exposed to the less intense light becomes surface; (g) etching away the thin film exposed to the more intense light and surfaced till the transparent substrate becomes surface; and (h) eliminating the remnant photoresist.

7 Claims, 5 Drawing Sheets

METHOD OF MANUFACTURING A PHOTOMASK FOR AN OPTICAL MEMORY

FIELD OF THE INVENTION

The present invention relates to a method of manufacturing a photomask for preparations of an optical memory device.

DESCRIPTION OF THE RELATED ART

In recent years, optical memory device as high-density, large-capacity memory means has been increasingly needed. Such optical memories can be classified into three types in accordance with their applications, memories of read-out-only, write once read many memories, and rewritable memories. Of them, optical memories employed as the write once read many memory and rewritable memory usually have guide tracks on their substrates to guide optical beams for recording, reproducing and erasing information to specified locations in the optical memories, and also have formatting pits for identifying the order of the tracks. If a single track is sectioned into a plurality of sectors in use, the formatting pits are often provided in advance with information about sector addresses and the like.

Specifically, as shown in FIG. 4, guide tracks 1b and 11b of an optical memory are different from formatting pits 11a in depth, and each of the formatting pits 11a is positioned between the adjacent guide tracks 11b. It has been known that, in the reading, when optical beams track in accordance with an optical differential system, preferably, the depth of the guide tracks 1b is fixed in approximately $\lambda/8$ n while the depth of the formatting pits 1a is fixed in approximately $\lambda/4$ n, where the wavelength of the employed light is $\lambda$ and the refractive index of the substrate is n.

There are known several methods of forming such guide tracks and formatting pits on a glass substrate by the process including the contact printing and dry etching. An example of such methods is the art including the steps described below. Now the scheme of the art will be described with reference to FIG. 3.

(a) First Step (FIG. 3(a)): A thin film 2 of Cr (chrome), Ti (titanium), Ta (tantalum), or the like, is formed on a photomask substrate 1 so that light transmission amount depents upon a film thickness.

(b) Second Step (FIG. 3(b)): A positive type photoresist film 3 is formed on the thin film 2, and then it is pre-baked.

(c) Third Step (FIG. 3(c)): Two beams of laser ray, argon laser and the like, are focused, respectively, and the laser beams are moved with the rotation of the photomask substrate 1, so that a photoresist film 3 can be exposed to the beam in a spiral. One of the beams, laser ray 4, is for exposing the formatting pits 1a by intermittently irradiating them with sufficient intensity, while the other, laser ray 5, is for exposing the guide tracks 1b by continuously irradiating them with less intensity than the laser ray 4.

(d) Fourth Step (FIG. 3(d)): After the exposure, developing and post-baking processes are performed in this order. At this time, the formatting pits 1a are subjected to a great exposure, and the photoresist film 3 in the corresponding region is removed to expose the thin film 2. On the other hand, the photoresist film 3 in the guide tracks 1b exposed to the less intense ray is also removed, but not so deep as to expose the thin film 2.

(e) Fifth Step (FIG. 3(e)): The thin film 2 is etched by the dry etching. In this step, the photoresist 3 is also etched together. In the formatting pits 1a where the thin film 2 is exposed after the development, the etching of the thin film 2 starts in accord with the start of the etching, and it ends when all the thin film 2 in this region is completely removed to expose the substrate 1. In the guide tracks 1b where the photoresist 3 still remains, however, the photoresist 3 is first etched and then the thin film 2 is done. Thus, when the etching ends, the guide tracks 1b have the remnant thin film 2 of a specified thickness.

(f) Sixth Step (FIG. 3(f)): Eventually, eliminating the still remaining photoresist 3, the formatting pits 1a are provided with a photomask transmitting a great amount of ray or light, while the guide tracks 1b are provided with a photomask transmitting less ray or light.

With use of the photomask manufactured in this way, a photoresist pattern is formed in a photoresist coated on a glass substrate by the contact printing so that different depths between the formatting pits and guide tracks are resulted on the pattern, and the dry etching is performed to form grooves on the glass substrate so as to have different depths between the formatting pits and guide tracks.

Therein, lies the importance of providing a uniform thickness to thin film 2 remaining in the guide tracks 1b in the photomask. This is because, assuming that a thin film of Ta is employed, for example, an amount of the transmitted light is 1.00 with no Ta film remaining, 0.65 with the Ta film remaining by 50 Å, and 0.52 with the Ta film remaining by 75 Å. In other words, the 25 Å difference in thickness of the thin films causes the amount of the transmitted light to vary by 13%, and the similar variation is transferred to the photoresist pattern formed by the contact printing.

With a photomask manufactured in accordance with such a conventional method, the thickness of the thin film 2 in the guide tracks 1b is effected depending upon three factors: a laser power in the exposure, a thickness of the photoresist 3 unremoved in the developing step (this is determined by requirements of the development and the like), and a difference in speed between etching the photoresist 3 and thin film 2 in the etching step. Therefore, there is the disadvantage that preparations of the thin film 2 in the guide tracks with even thickness and with good reproducibility is difficult.

SUMMARY OF THE INVENTION

The present invention includes a method of manufacturing a photomask for an optical memory, the photomask having two types of pattern where guide tracks and formatting pits are different in amount of optical transmission, included steps are: (a) forming on a transparent substrate a thin film of which light transmission amount depends upon its thickness; (b) forming a photoresist film on the thin film; (c) exposing the photoresist film to light with different intensities depending selectively on the guide tracks or formatting pits; (d) eliminating the photoresist film exposed to the more intense light to yield a first thin film surface; (e) etching the first thin film exposed to the more intense light and surfaced; (f) eliminating the photoresist film at portion exposed to the relatively less intense light becomes surface; (g) etching away the first thin film exposed to transparent substrate; and (h) eliminating the remnant photoresist.

Preferably, the thin film formed in the step (a) is made of Cr, Ti or Ta.

Preferably, the thin film formed in the step (a) has a thickness of 100 Å to 1000 Å.

Preferably, the photoresist film formed in the step (b) has a thickness of 1000 Å to 4000 Å.

Preferably, the thin film subjected to the etching in the step (e) is etched till its thickness becomes 10 Å to 200 Å.

Preferably, the etching in the steps (e) to (g) is a dry etching.

Preferably, the photoresist film formed in the step (b) is a positive-type resist, and the method of eliminating the resist in the steps (f) and (h) is an ashing method.

DETAILED DESCRIPTION OF THE PREFERRED EMBODIMENT

While the present invention will be described in detail in conjunction with preferred embodiments shown in the accompanying drawings, it is not intended that the present invention be limited to the precise form disclosed in the description.

Figure 1A:
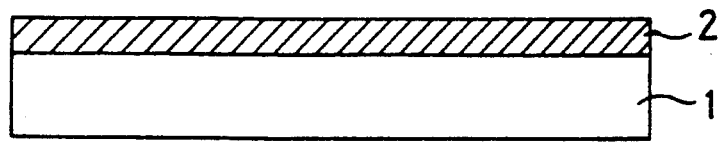
FIG. 1(a)-1(h) is a diagram showing the steps of manufacturing a photomask according to the present invention.
Figure 1B:
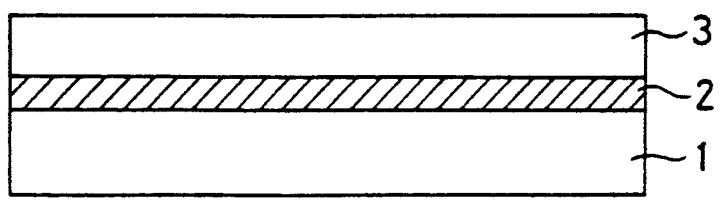
Figure 1C:
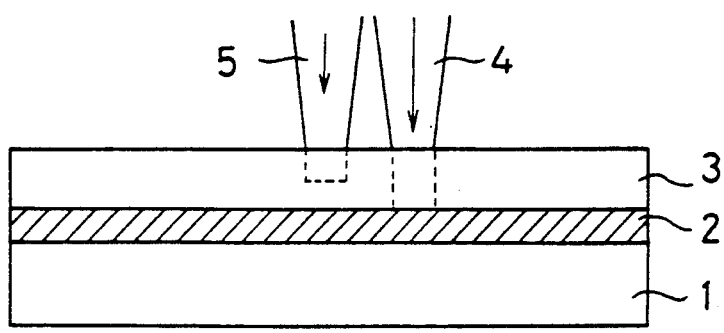
Figure 1D:
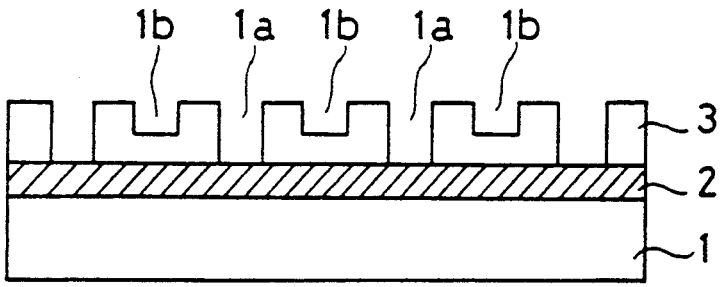
Figure 1E:
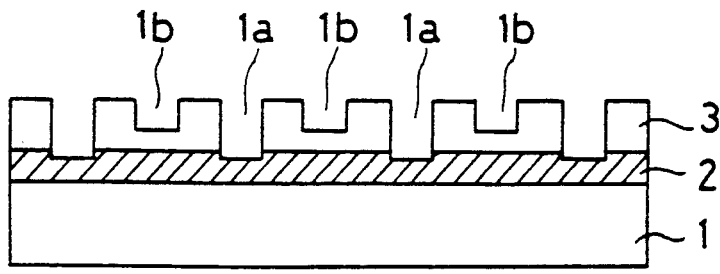
Figure 1F:
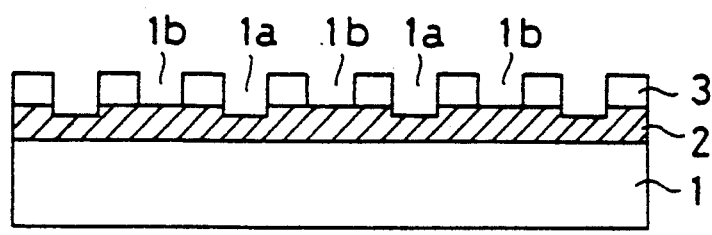
Figure 1G:
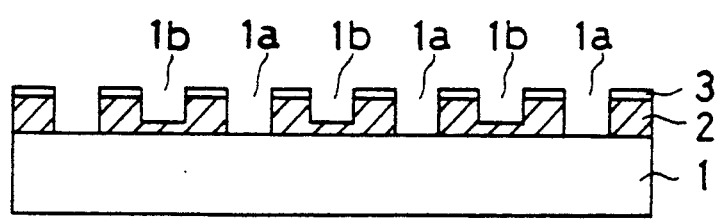
Figure 1H:
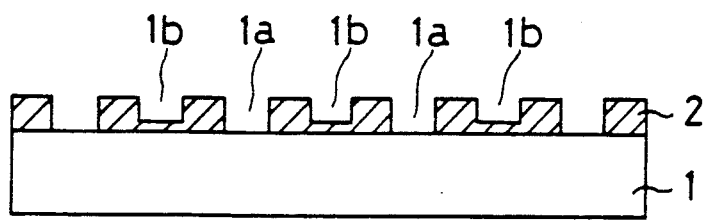
Figure 2:
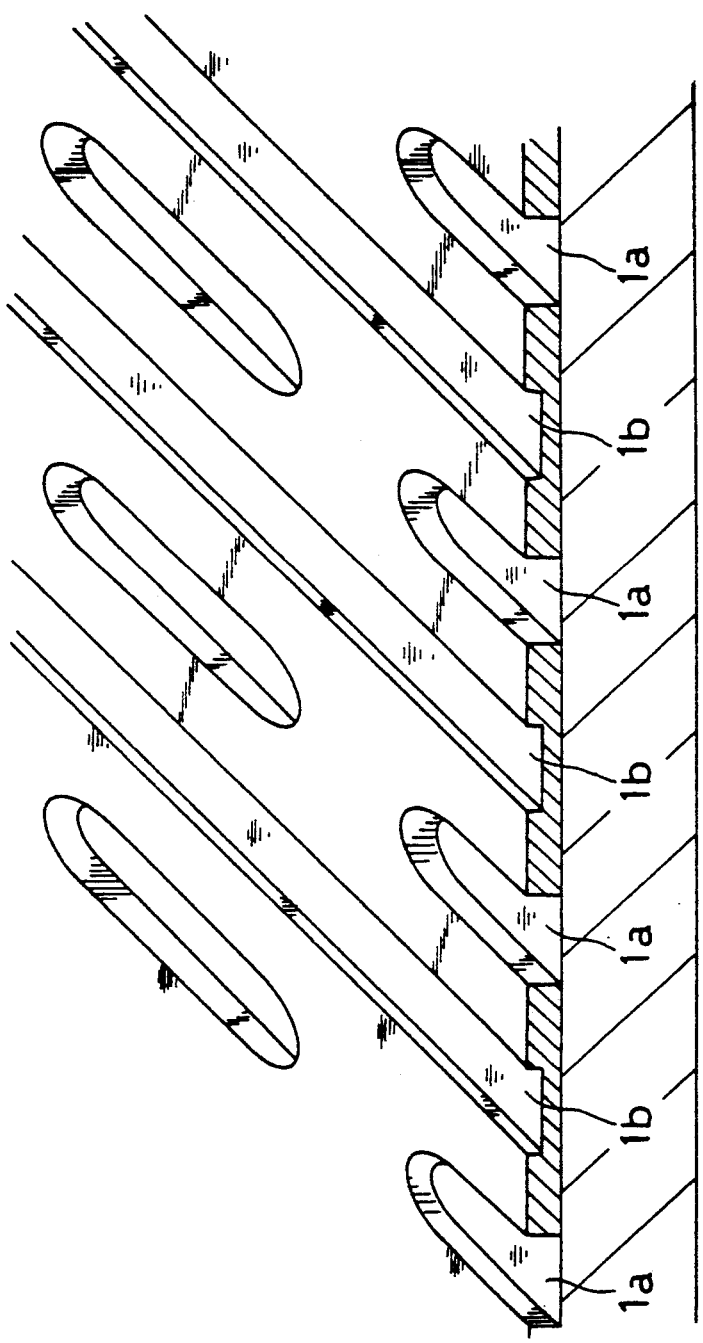
FIG. 2 is a partial enlarged perspective view showing the photomask.
Figure 3A:
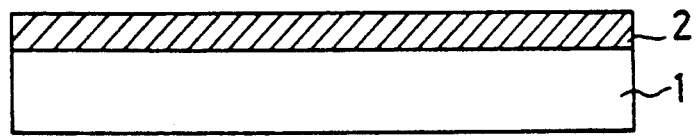
FIG. 3(a)-3(f) is a diagram for explaining the steps of manufacturing a conventional photomask.
Figure 3B:
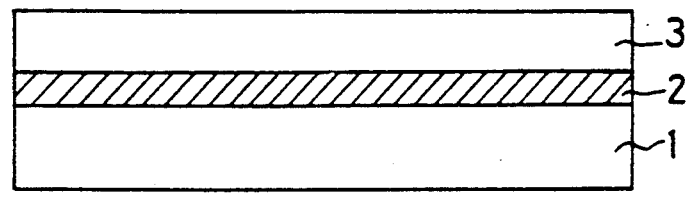
Figure 3C:
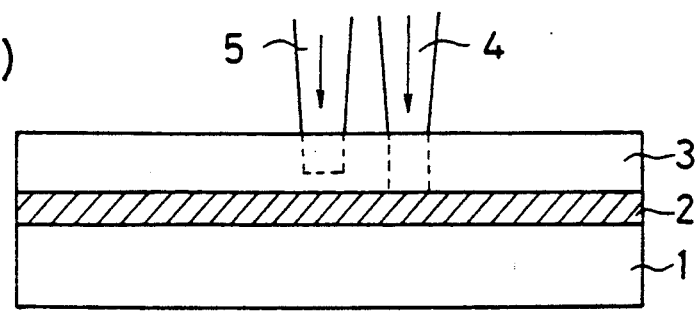
Figure 3D:
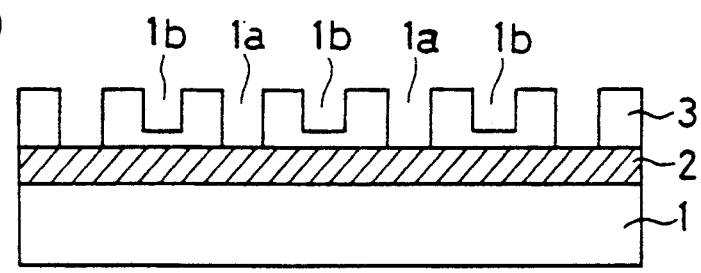
Figure 3E:
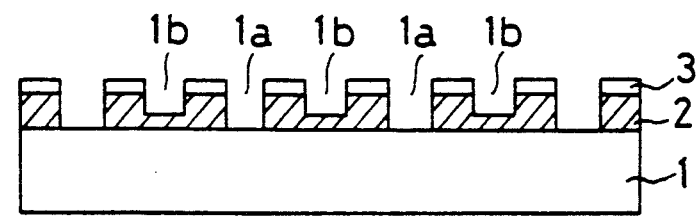
Figure 3F:
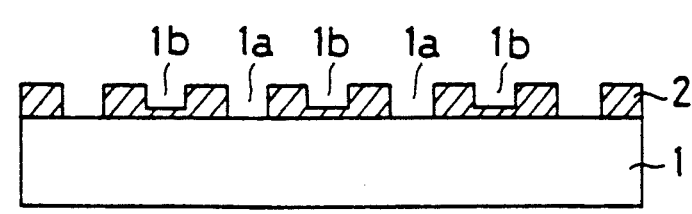
Figure 4:
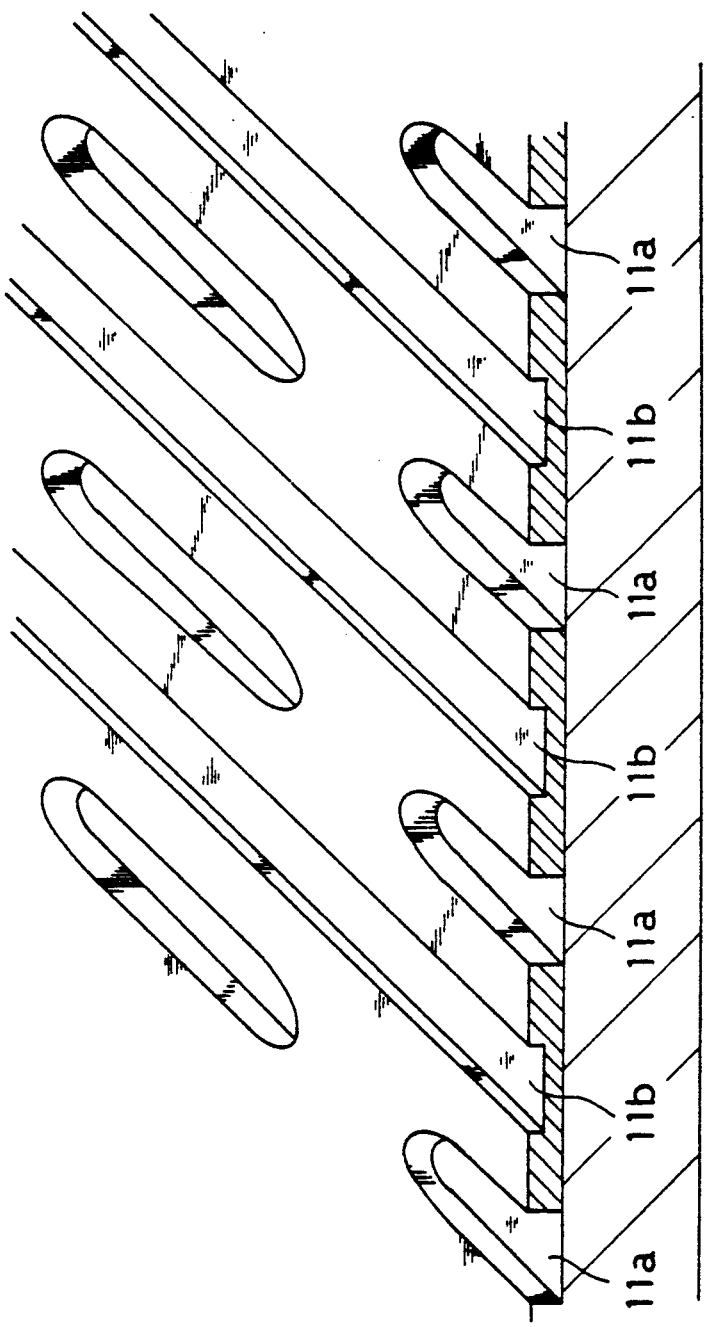
FIG. 4 is an enlarged partial perspective view showing a substrate of the optical memory.

FIG. 1 shows a method of manufacturing a photomask according to the present invention, while FIG. 2 perspectively shows an enlarged part of the photomask.

(a) First Step (FIG. 1(a)): A thin film 2 of Cr (chrome), Ti (titanium), Ta (tantalum), or the like, of which light transmission amount depends upon a film thickness, is formed on a photomask substrate 1, having a thickness of 100 Å to 1000 Å.

(b) Second Step (FIG. 1(b)): A positive type photoresist film 3 is formed with thickness of 1000 Å to 4000 Å on the thin film 2, and then it is pre-baked at about 95° C.

(c) Third Step (FIG. 1(c)): Two argon laser beams are focused, and the laser beams are moved with the rotation of the photomask substrate 1, so that a photoresist film 3 can be exposed to the beam in a spiral. One of the laser beams, laser light 4, is for exposing the formatting pits 1a by intermittently irradiating them with sufficient intensity (e.g., 1.2 mW in an inner edge of the data area of the optical memory; 2.4 mW in its outer edge), while the other, laser ray 5, is for exposing the guide tracks 1b by continuously irradiating them with less intensity than the laser ray 4 (e.g., 0.9 mW in the inner edge of the data area of the optical memory; 1.8 mW in its outer edge).

(d) Fourth Step (FIG. 1(d)): After the exposure, developing and post-baking processes are performed in this order. At this time, the formatting pits 1a are subjected to a great exposure, and the photoresist film 3 in the corresponding region is removed to expose the thin film 2. On the other hand, the photoresist film 3 in the guide tracks 1b exposed to the less intense ray is also removed, but not so deep as to expose the thin film 2.

(e) Fifth Step (FIG. 1(e)): The thin film 2 is etched by 10 Å to 200 Å by the dry etching.

(f) Sixth Step (FIG. 1(f)): The photoresist film 3 is eliminated by the ashing till the thin film 2 in the guide tracks 1b is exposed.

(g) Seventh Step (FIG. 1(g)): The dry etching is performed till the thin film 2 in the formatting pits 1a is completely eliminated and the photomask substrate 1 is exposed.

(h) Eighth Step (FIG. 1(h)): Eventually, the still remaining photoresist is eliminated by the ashing.

According to this method, the resultant photomask has the thin film 2 in the guide tracks 1b, of which thickness is enabled to be determined by the etching of the thin film 2 in the above-mentioned fifth and seventh steps.

In accordance with the present invention, with additional one etching step and one photoresist eliminating step introduced to the conventional manufacturing method, a thickness of a thin film in guide tracks can be determined only by the etching step of the thin film. Thus, the causes of error in manufacturing is removed, and so, a photomask for an optical memory is permitted to be manufactured to have an even thickness and a good reproducibility.

What is claimed is:

1. A method of manufacturing a photomask for an optical memory with said photomask having guide tracks and formatting pits with differing amounts of optical transmission, comprising the steps of:
    (a) Forming on a transparent substrate a thin film of a material through which the amount of light transmission depends upon its thickness;
    (b) forming a photoresist film on the thin film;
    (c) exposing the photoresist film on the guide tracks and the formatting pits to light having different relative light intensities wherein the photoresist over the guide tracks is exposed to relatively less intense light than the photoresist over the formatting pits;
    (d) developing the photoresist film to expose the thin film at the formatting pits and to retain some photoresist film at the guide tracks;
    (e) etching the thin film at the formatting pits only;
    (f) eliminating the photoresist film to expose the thin film at the guide tracks;
    (g) etching the thin film essentially to expose the transparent substrate at the formatting pits; and
    (h) eliminating the remnant photoresist.

2. A method according to claim 1, wherein the thin film formed in the step (a) is made of Cr, Ti or Ta.

3. A method according to claim 1, wherein the thin film formed in the step (a) has a thickness of 100 Å to 1000 Å.

4. A method according to claim 1, wherein the photoresist film formed in the step (b) has a thickness of 1000 Å to 4000 Å.

5. A method according to claim 1, wherein the thin film subjected to the etching in the step (e) is etched till its depth becomes 10 Å to 200 Å.

6. A method according to claim 1, wherein the etching in the steps (e) and (g) is a dry etching.

7. A method according to claim 1, wherein the photoresist film formed in the step (b) is a positive-type resist, and the method of eliminating the resist in the steps (f) and (h) is an ashing method.

* * * * *